United States Patent [19]

Betrabet et al.

[11] Patent Number: 5,066,544

[45] Date of Patent: Nov. 19, 1991

[54] DISPERSION STRENGTHENED LEAD-TIN ALLOY SOLDER

[75] Inventors: Hemant S. Betrabet, Peekskill; Otmar H. Boser, Scarsdale; Robert H. Kane, Hohokus; Susan McGee, Peekskill; Thomas Caulfield, Croton Falls, all of N.Y.

[73] Assignee: U.S. Philips Corporation, New York, N.Y.

[21] Appl. No.: 573,440

[22] Filed: Aug. 27, 1990

[51] Int. Cl.$^5$ ..................... C22C 13/00; C22C 11/06
[52] U.S. Cl. .................... 428/614; 428/643; 420/558; 420/570
[58] Field of Search ............... 428/614, 646, 643, 644, 428/645, 647, 648; 420/558, 559, 570, 571; 148/405, 419; 228/56.3, 263.11

[56] References Cited

U.S. PATENT DOCUMENTS

| | | | |
|---|---|---|---|
| 2,107,223 | 2/1938 | Swartz | 420/571 |
| 2,148,741 | 2/1939 | Gonser | 148/405 |
| 2,189,064 | 2/1940 | La Grange | 148/405 |
| 3,163,500 | 12/1964 | Konrad et al. | 428/614 |
| 3,355,284 | 11/1967 | Harvey | 148/405 |
| 3,411,961 | 11/1968 | Harvey | 148/405 |
| 3,605,902 | 9/1971 | Ault | 428/605 |
| 3,622,283 | 11/1971 | Sara | 428/614 |
| 3,690,961 | 9/1972 | Borghezan | 428/614 |
| 4,018,599 | 4/1977 | Hill et al. | 75/165 |
| 4,018,630 | 4/1977 | Hill et al. | 148/11.5 P |
| 4,622,205 | 11/1986 | Fouts et al. | 420/570 |
| 4,752,537 | 6/1988 | Das | 425/614 |
| 4,834,939 | 5/1989 | Bornstein | 419/21 |
| 4,916,029 | 4/1990 | Nagle et al. | 148/405 |
| 4,916,030 | 4/1990 | Christodoulou et al. | 148/405 |
| 4,927,712 | 5/1990 | Lhymn | 428/614 |

FOREIGN PATENT DOCUMENTS

| | | | |
|---|---|---|---|
| 2713196 | 10/1978 | Fed. Rep. of Germany | 420/559 |
| 2758940 | 7/1979 | Fed. Rep. of Germany | 420/570 |
| 41-18807 | 10/1966 | Japan | 420/558 |
| 45-1553 | 1/1970 | Japan | 420/570 |
| 57-181353 | 11/1982 | Japan | 420/570 |
| 61-219145 | 9/1986 | Japan | 420/571 |
| 317776 | 1/1957 | Switzerland . | |

OTHER PUBLICATIONS

P. B. Kadam et al., "High Temperature Creep Behaviour of Lead-base Particulate Composites", J. of Materials Science 18 (1983) 140-144.

Primary Examiner—John J. Zimmerman
Attorney, Agent, or Firm—Norman N. Spain

[57] ABSTRACT

An improved dispersion strengthened lead-tin alloy solder is provided in which there is dispersed in the solder up to about 5 vol. percent of small particles, of a metal sulfide or a nickel-tin intermetallic.

12 Claims, 2 Drawing Sheets

DISPERSION STRENGTHENED LEAD-TIN ALLOY SOLDER

BACKGROUND OF THE INVENTION

The present invention relates to lead-tin alloy solders, in particular to dispersion strengthened lead-tin alloy solders. The increased demand for miniaturization and the use of surface-mounted technology in the microelectronics industry place more stringent requirements on solders which serve as mechanical interconnects as well as electrical contacts between surface mounted devices (SMD) and printed circuit substrates.

Solder joints employed under these conditions frequently undergo degradation due to thermal cycling. Such thermal cycling may occur during high temperatures employed in circuit board processing, and, as a result of temperature fluctuations in the ambient and component power cycling Thermal cycling tends to degrade solder joints because of the development of shear stresses arising from inherent thermal expansion mismatch normally occuring between most components and substrates. Service temperatures at which these assemblies are employed frequently are high relative to the absolute melting point. As a result, the microstructures of these solders tend to be highly unstable under typical operating conditions. Such unstable microstructures lead to recrystallization and grain growth resulting in a loss of strength. Because of this, soldered joints are likely to be prone to fatigue cracking.

In order to eliminate or reduce the extent of these problems, it has been found very useful to stabilize the microstructure of solders after reflow. In order to achieve such stabilization, two procedures may be employed. One approach is precipitation hardening in which a fine and homogeneous dispersion of an equilibrium phase precipitates from the solid solution. In the other approach, dispersion strengthening is employed in which additional material is introduced into the solder by external means.

While both approaches may lead to solder joints of higher strength and better control of the microstructure, there are certain problems in the applications of either of these methods. The method of precipitation hardening is difficult to employ for several reasons. Among these reasons are the materials which are to be added must be compatible with the metal matrix; precipitation must occur only in the solid state over a highly restricted temperature range; the resultant precipitates are quite likely to coarsen rapidly as a result of the same diffusional processes that allow their formation, and these coarsened precipitates may be detrimental to the mechanical properties of the soldered joint.

The other method that may be employed, the use of extrinsic dispersoids has advantages over the use of the precipitation hardening method in that better control of the solder microstructure is possible, and there is a greater choice of strengthening materials that may be incorporated into the metal matrix.

However, solders that are used in the microelectronic industry generally must undergo melting and resolidification before being employed to form a soldered joint. During such procedures, solid phases are normally rejected from the melt or particle agglomeration occurs in the melt. Therefore, it is considered to be necessarily implied that for the production of useful dispersion strengthened lead-tin alloy solders that the material dispersed in the solder, resist rejection from the melt and resist coarsening when present in the solder joint.

Hill et al, U.S. Pat. No. 4,018,599, shows dispersion strengthening of gold contacts by dispersing $CeO_2$ in the gold. Hill et al, U.S. Pat. No. 4,018,630, shows dispersion strengthening of silver contacts by dispersing $CeO_2$ in the silver. Bornstein, U.S. Pat. No. 4,834,939 shows a silver base contact material in which cadmium oxide and nickel particles are dispersed. However, none of these patents are concerned with dispersion strengthening of lead-tin alloy solder.

Swiss Patent CM 317,776 shows a solder alloy of copper nickel in which 1.1 to 1% by weight zinc is dispersed. There is no suggestion in the Swiss patent that the zinc results in dispersion strengthening of the solder. In addition, there is no suggestion in the Swiss patent that the copper-nickel alloy of the Swiss patent which is primarily used for biasing is at all relevant to a lead-tin solder employed in making solder joints.

JP 54-152493 shows that solder joints formed by gold-tin alloy may be improved by the incorporation into the alloy of a small amount of nickel. The Japanese patent also teaches that improvement in the strength and hardness of the soldered joint results and that the nickel forms $Ni_3Sn_4$ during formation of this soldered joint by heating.

Strengthening of the joint that is produced by the method of this patent is due to precipitation hardening. As a result, the distribution and amount of the precipitation that is formed ($Ni_3Sn_4$) and consequently the strength of the joint depends upon the joining procedure and the subsequent treatment employed.

SUMMARY OF THE INVENTION

A principal object of this invention is to provide a lead-tin alloy solder which forms soldered joints of improved strength and durability. A particular object of this invention is to provide improved dispersion-strengthened lead-tin alloy solder. These and other objects of the invention will be apparent from the description that follows.

According to the invention, a dispersion strengthened lead-tin alloy solder containing nickel-tin particles of a nickel-tin intermetallic or a metal sulfide in an amount up to 5 vol.%, in which the size of the particles are less than 5μm, is prepared.

It has been found that joints formed from the novel solder of the invention have significantly improved strength and durability, particularly at high temperatures, than known lead-tin alloy solders.

DETAILED DESCRIPTION OF THE INVENTION

Figure 1:
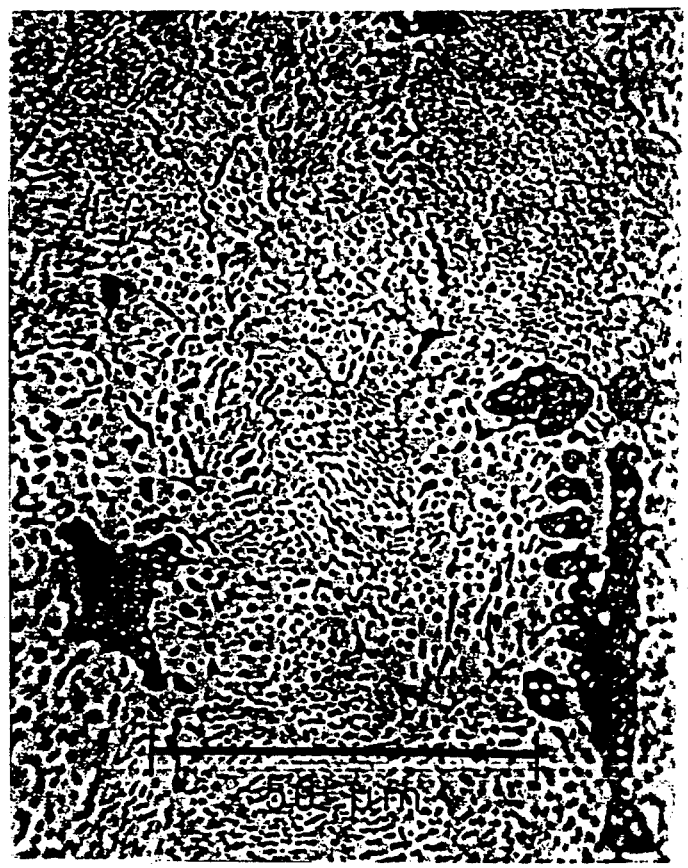
FIGS. 1 and 3 of the drawing are photomicrographs of sections of soldered joints formed from solder of the prior art.

Preferably the solder of the invention contains from 0.5–5 vol. percent of the dispersed particles. Most preferably the dispersed particles are present in the amount of 0.2–2 vol. percent.

Incorporation of particles of less than 5 μm has been found to give very good results. However it has been found that even better results are obtained when the particle size is less than 1 μm.

Among the examples of the particles that may be employed, when the particles are metal sulfides, are iron sulfides and manganese sulfides.

When the particles are intermetallics, the particles are preferably to consist of nickel-tin intermetallics. Examples of such intermetallics are $Ni_3Sn_4$ and $Cu_9NiSn_3$.

The lead-tin alloy solders that may be employed in forming the solder of the invention are solders consisting of about 60 percent by weight of tin and about 40 percent by weight of lead and lead-tin solders containing about 95 percent by weight of lead and 5 percent by weight of tin.

For greater understanding the invention will now be described with reference to the following example and the figures of the drawing.

EXAMPLE

A solder that is formed of lead-tin alloy containing 60 weight percent of tin and 40 weight percent of lead. The alloy was melted and 1–2 vol. percent of particle of $Ni_3Sn_4$ of a particle size of less than 1μm were added. Two copper blocks were then soldered together by means of the resultant solder.

In a comparative example two copper blocks of the same configuration were soldered together in the same manner using lead-tin alloy solder of the same lead/tin ratio but one in which no particles of $Ni_3Sn_4$ were dispersed.

Figure 2:
FIGS. 2 and 4 are photomicrographs of sections of joints formed from solder of the invention.
Figure 3:
Figure 4:

Sections were made of the resultant joints immediately after solidification and after being held at 100° C. for 29 hours. FIG. 1 shows a photomicrograph of a section of the joint produced by the lead-tin solder in the absence of the dispersed particles immediately after formation. FIG. 3 shows a photomicrograph of a section of this solder after being held for 29 hours at 100° C. FIG. 2 shows a photomicrograph of a section of a joint produced by the solder of the invention immediately after formation. FIG. 4 shows a photomicrograph of a section of this joint after being held 29 hours at 100° C.

As will be noted, the grains present in the joint made by the invention are much finer than those present in the joint produced from the solder not containing the dispersed particles.

Additionally, as shown by FIG. 4, there was no enlargement of the grains present in the joint produced by the solder of the invention even after being heated for 29 hours at 100° C.

As shown in FIG. 3 there was a considerable coarsening and enlargement of the grains present in the joint produced from the solder not containing the dispersed particles. This grain coarsening and enlargement increase the susceptibility to fatigue and is likely to result in eventual breaking of the joint. In contrast, the joint produced from the solder of the invention shows a fine grain structure, after same heat treatment, and thus is much less likely to exhibit fatigue and resultant breaking.

What is claimed is:

1. A dispersion strengthened lead-tin alloy solder comprising up to 5vol. % of particles of a material selected from the group consisting of nickel-tin intermetallics and/or metal sulfide, the size of said particles being less than 5μm.

2. The solder of claim 1 wherein 0.5-5 vol.% of the particles are present.

3. A soldered joint formed from the solder of claim 1.

4. A dispersion strengthened lead-tin alloy solder comprising 0.2-2 vol. percent of particles of a material selected from the group consisting of nickel-tin intermetallics and/or metal sulfide, the size of said particles being less than 5 μm.

5. The solder of claim 1 wherein the particles are particles of a metal sulfide.

6. The solder of claim 5 wherein the size of the particles is less than 1 μm.

7. The solder of claim 6 wherein the particles are of iron sulfide or manganese sulfide.

8. The solder of claim 7 wherein the lead-tin alloy is an alloy consisting of about 60% by weight of Sn and about 40% by weight of Pb or an alloy of about 95% by weight of Pb and 5% by weight of Sn.

9. The solder of claim 1 wherein the particles are particles of nickel-tin intermetallics.

10. The solder of claim 9 wherein the size of the particles is less than 1μm.

11. The solder of claim 10 wherein the particles are particles of $Ni_3Sn_4$ or $Cu_9NiSn_3$.

12. The solder of claim 11 wherein the lead-tin alloy is an alloy consisting of about 60% by weight of Sn and about 40% by weight of Pb or an alloy of about 95% by weight of Pb and 5% by weight of Sn.

* * * * *